United States Patent
Kabune

(10) Patent No.: US 7,009,537 B2
(45) Date of Patent: Mar. 7, 2006

(54) APPARATUS FOR DETECTING A/D CONVERTER ABNORMALITY

(75) Inventor: Hideki Kabune, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/006,406

(22) Filed: Dec. 7, 2004

(65) Prior Publication Data

US 2005/0160334 A1   Jul. 21, 2005

(30) Foreign Application Priority Data

Dec. 16, 2003   (JP)   ............................. 2003-418367

(51) Int. Cl.
*H03M 1/10*   (2006.01)

(52) U.S. Cl. ..................... 341/120; 341/118
(58) Field of Classification Search ................ 341/155, 341/120, 118
See application file for complete search history.

(56) References Cited

U.S. PATENT DOCUMENTS

| | | | | |
|---|---|---|---|---|
| 3,982,226 A | * | 9/1976 | Bunker et al. ............... | 714/758 |
| 5,432,514 A | * | 7/1995 | Mukuda et al. .............. | 341/120 |
| 6,163,291 A | * | 12/2000 | Uchino et al. ............... | 341/163 |
| 6,518,900 B1 | * | 2/2003 | Oehler et al. ................ | 341/120 |
| 6,734,818 B1 | * | 5/2004 | Galton ........................ | 341/161 |
| 6,750,800 B1 | | 6/2004 | Yoshinaga ................... | 341/172 |
| 6,933,867 B1 | * | 8/2005 | Honda ......................... | 341/118 |
| 2005/0052307 A1 | * | 3/2005 | Nakano et al. .............. | 341/155 |

FOREIGN PATENT DOCUMENTS

| | | |
|---|---|---|
| JP | 2000-151405 | 5/2000 |
| JP | 2000-209090 | 7/2000 |
| JP | 2001-111423 | 4/2001 |

\* cited by examiner

*Primary Examiner*—Peguy JeanPierre
(74) *Attorney, Agent, or Firm*—Harness, Dickey & Pierce, PLC

(57) ABSTRACT

An apparatus for detecting an abnormality in an A/D converter has a voltage accumulating capacitor. The apparatus includes a storage circuit which receives analog signals whose range of signal operation voltage when normal is limited to be narrower than the range of input operation voltages, and stores in advance the range of abnormal voltages of digital signals converted by the A/D converter, and determines the A/D converter to be abnormal when the digital signal voltage lies in the range of abnormal voltages. The A/D converter converts the analog signal voltage into a digital signal voltage, and then initializes the analog signal voltage of the capacitor to a voltage in the abnormal voltage range.

18 Claims, 10 Drawing Sheets

APPARATUS FOR DETECTING A/D CONVERTER ABNORMALITY

CROSS REFERENCE TO RELATED APPLICATION

This application is based on and incorporates herein by reference Japanese Patent Application No. 2003-418367 filed on Dec. 16, 2003.

FIELD OF THE INVENTION

The present invention relates to an apparatus for detecting an A/D converter abnormality.

BACKGROUND OF THE INVENTION

An A/D converter (analog/digital converter) is used to convert analog signals received from sensors into digital signals that can be used in a control circuit such as a microcomputer of a control apparatus, when electronic signal processing is executed depending upon the state of the signals received from the sensors.

In an anti-lock braking system of a vehicle, for example, an abnormality in a sensor or in an A/D converter should be avoided. Therefore, various countermeasures are proposed to detect an abnormality in the sensors and in the A/D converter so that the control apparatus will not fall in a fatal state.

JP 2000-151405A proposes to monitor the function of the A/D conversion by providing a monitoring A/D converter independent from the input A/D converter and comparing the results of the two A/D conversions.

This apparatus requires a plurality of A/D converters or requires an A/D converter of a circuit of a large scale. Therefore, the circuit construction and the control become complex, causing an increase in the number of parts and in the production cost. Besides, it cannot be determined which one of the A/D converters is abnormal.

FIG. 11 illustrates another prior art using a monitoring A/D converter. In this example, an electric current flowing into a motor 31 is found by measuring a voltage across both ends of a resistor 36. The electric current is found by dividing the voltage across both ends of the resistor 36 by the resistance of the resistor 36. The voltage (analog signal) across both ends of the resistor 36 is input to a terminal AIN1 of an A/D converter 34 via an amplifier 32. The voltage across both ends of the resistor 36 is further input to a terminal AIN2 of an A/D converter 35 via a monitoring amplifier 33.

In this apparatus, a microcomputer 37 compares the result of A/D conversion by the A/D converter 34 with the result of A/D conversion by the A/D converter 35 to detect abnormal condition in the A/D converters 34 and 35. In the example of FIG. 11, too, two A/D converters are used for one sensor (analog signal input), and the circuit scale becomes large.

SUMMARY OF THE INVENTION

In view of the above circumstances, it is an object of the present invention to provide an apparatus for detecting an A/D converter abnormality, which has a simple circuit construction and does not increase the production cost.

According to this invention, a voltage of an analog signal stored in a capacitor after the end of the A/D conversion until the start of the next A/D conversion serves as a value by which it can be determined that the analog signal is abnormal. If an abnormal condition occurs such as a breakage in the line from the analog signal source to the input terminal or from the input terminal in the A/D converter to the capacitor, the electric charge stored in the capacitor remains unchanged assuming a value by which it can be determined that the analog signal is abnormal.

When the A/D conversion is effected in this state, the value after the conversion becomes abnormal and, hence, the A/D conversion is determined to be abnormal. When there is no abnormal condition such as breakage in the line, the electric charge accumulated in the capacitor varies depending upon an input from the analog signal source. It can therefore be so determined that the A/D conversion is normally conducted from the value after the A/D conversion.

Concerning the initialization, a voltage of an analog signal at the time being initialized into a voltage that lies in a range of abnormal voltages can, preferably, be set to be a higher reference voltage of reference voltages that serve as a reference for comparison with the analog signal at the time of A/D conversion. From the standpoint of designing analog signal processing circuits such as sensors, the voltage range when the input analog signal is normal is not selected to be that of a power source which cannot be highly accurately designed or is not selected to be close to GND. It is, in many cases, selected to be in grange of, for example, 10 to 90% of the reference voltage.

As for the important inputs, therefore, the voltages are regarded to be abnormal when other voltages are input, from which it is presumed that abnormal conditions are occurring, such as breakage in the signal line, short circuit, etc. That is, when the input analog signal voltage is smaller than 10% or is greater than 90% of the reference voltage, the analog signal is determined to be abnormal.

If the analog voltage value to be initialized in this construction is set to be the higher reference voltage (VREF+), i.e., 100% of the reference voltage and if the range of determining the abnormality is set to be, for example, not smaller than 90% of the reference voltage, then, the input system is determined to be abnormal even when abnormal condition occurs between the analog signal source and the input terminal or between the input terminal in the A/D converter and the capacitor.

Similarly, if the analog voltage value at the time of initialization is set to be the lower reference voltage (VREF−) of the reference voltage, i.e., 0% of the reference voltage and if the range of determining the abnormality is set to be, for example, not larger than 10% of the reference voltage. Then, the input system is determined to be abnormal even when abnormal condition occurs between the analog signal source and the input terminal or between the input terminal in the A/D converter and the capacitor.

As for detecting an abnormality, preferably, provided is ideal value storage circuit for storing an ideal value obtained by the A/D conversion of a voltage of when a voltage accumulated in the capacitor is initialized by initializing means with at least one input terminal opened. An A/D-converted digital signal value with the input terminal opened is compared with an ideal value, and the A/D converter is determined to be abnormal when the difference between the two exceeds a predetermined value.

Usually, when one input of the A/D converter is opened, the voltage input to the A/D converter becomes the one of when a sample holding capacitor is initialized. However, when the initializing function of the sample-holding capacitor becomes abnormal or when the input channel selection switch develops an on-stuck abnormality, the voltage input to the A/D converter does not become the voltage at the time of initializing the sample-holding capacitor. It can be so determined that the initializing function of the sample-holding capacitor is abnormal or the input channel selection switch is developing an on-stuck abnormality.

According to this invention, further, a relationship of a voltage of a digital signal after A/D conversion to a voltage of the analog signal source depends upon the characteristics of the A/D converter. This relationship can be expressed as a straight line (having linearity) maintaining a predetermined inclination. Namely, a voltage of a digital signal after the A/D conversion is nearly exclusively determined relative to the voltage of the analog signal that is input. The storage circuit stores, as an estimated value, a digital signal value after the A/D conversion for the voltage of a predetermined analog signal formed by a stabilized power source which is neither the power source of the A/D converter nor the stabilized power source connected to the reference voltage.

A value obtained by putting the analog signal to the A/D conversion is compared with the estimated value. When the difference between the two exceeds a predetermined value, it is so determined that any one of the comparison selecting circuit including the reference voltage, AD power source voltage or the analog signal voltage is abnormal.

As for the A/D converter incorporated in the microcomputer that operates on a plurality of power sources, the microcomputer incorporates an analog voltage forming circuit that forms a predetermined analog voltage from a power source that is connected to neither the power source of the A/D converter incorporated therein nor the reference voltage, and detects abnormal condition in the comparison selecting circuit including the reference voltage, in the AD power source voltage and in the analog voltage forming circuit based on the result obtained by putting the analog voltage to the A/D conversion.

According to this invention, further, voltages of at least two points are set such that the values after the A/D conversion establish a predetermined relationship. A relationship of the voltages of at least the two points is found from the values obtained by putting the voltages of at least the two points to the A/D conversion. The calculated relationship of voltages of at least the two points is compared with a predetermined relationship. The A/D converter is determined to be abnormal when the difference between the two exceeds a predetermined value. Therefore, the A/D conversion is determined to be abnormal when the relationship of the two points based on the A/D-converted values of the two points is greatly different from the predetermined value (ideal state).

Preferably, the linearity calculated from the voltages of at least the two points can be set as a predetermined relationship. As described above, the A/D converter has linearity, and the A/D-converted values of the voltages of the predetermined two points have a nearly constant difference. When the difference between the A/D-converted values of these two points greatly varies, it can be determined that the A/D conversion is abnormal.

Preferably, a predetermined relationship is so set that a ratio of voltages of at least the two points assumes a predetermined value. That is, if one of at least the two inputs of the A/D converter is presumed to be a predetermined analog input A, another input can be an analog input B obtained by amplifying the predetermined analog input A by a predetermined amplification factor.

If voltages of the analog inputs A and B are denoted by Va and Vb, and the amplification factor by $\alpha$, then, a relationship $Vb=\alpha \times Va$ is obtained. From the linearity of the A/D converter, however, a relationship $Db=\alpha \times Da$ also holds between the digital values Da and Db after the A/D conversion. Therefore, when the relationship $Db=\alpha \times Da$ does not hold in the digital values after the A/D conversion, it is so determined that the A/D conversion is abnormal.

Preferably, if voltages of the analog inputs A and B are denoted by Va and Vb, and the offset voltage by Vof, then, a relationship $Vb=Va+Vof$ is obtained. From the linearity of the A/D converter, however, a relationship $Db=Da+Dof$ also holds between the digital values Da and Db after the A/D conversion. Here, Dof is a digital value of when the offset voltage Vof is put to the A/D conversion. Therefore, when the relationship $Db=Da+Dof$ does not hold in the digital values after the A/D conversion, it is so determined that the A/D conversion is abnormal.

Preferably, the predetermined relationship is so set that one of the voltages of at least the two points becomes equal to a value obtained by multiplying the other voltage of at least the two points by a predetermined ratio and then adding a predetermined value thereto. That is, if one of at least the two inputs of the A/D converter is presumed to be a predetermined analog input A, the other input can be an analog input B obtained by multiplying the predetermined analog input A by a predetermined amplification factor and further adding a predetermined offset voltage thereto.

If voltages of the analog inputs A and B are denoted by Va and Vb, the amplification factor by $\alpha$ and the offset voltage by Vof, then, a relationship $Vb=\alpha \times Va+Vof$ is obtained. From the linearity of the A/D converter, however, a relationship $Db=\alpha \times Da+Dof$ also holds between the digital values Da and Db after the A/D conversion. Here, Dof is a digital value of when the offset voltage Vof is put to the A/D conversion. Therefore, when the relationship $Db=\alpha \times Da+Dof$ does not hold in the digital values after the A/D conversion, it is so determined that the A/D conversion is abnormal.

Preferably, one of the voltages of the two points is set to be a voltage of when a voltage accumulated in a capacitor with the input open is initialized. In this construction, one of the voltages of at least the two predetermined points is placed in a state where the input is opened so that not only an abnormal linearly in the A/D converter can be detected but also an abnormality in the initializing function of the sample-holding capacitor and on-stuck abnormality of the input channel selection switch can be detected.

The input in an open state can be used for determining an abnormality. Besides, the input voltage becomes that of when a predetermined sample-holding capacitor is initialized, and becomes one of the predetermined voltages for determining the abnormality. It is therefore possible to detect an abnormality in the function for initializing the sample-holding capacitor, on-stuck abnormality of the input channel selection switch and abnormal linearity of the A/D converter relying upon a sophisticated circuit construction.

Preferably, at least one of the voltages of at least the two points input to the input terminals is set to a predetermined voltage formed by a power source separate from the power source for operating the A/D converter or separate from the power source forming a reference voltage that serves as a reference for the A/D conversion. In this construction, not only abnormal linearly in the A/D converter is detected but also abnormal condition is detected in the comparison reference voltage selection circuit including the reference voltage, in the AD power source voltage and in the predetermined voltage input.

Preferably, one of the inputs to the A/D converter is used for detecting an abnormality, and is used as the predetermined voltage so that abnormal condition in the comparison reference voltage selection circuit including the reference voltage, in the AD power source voltage, in the predetermined voltage input and in the linearity of the A/D converter can be detected with simpler circuit configuration.

Preferably, voltages at the two points are set to be the higher reference voltage and the lower reference voltage that serve as references for the A/D conversion. This construction, too, makes it possible to detect abnormal condition in the linearity of the A/D converter.

Preferably, the A/D converter has a capacitor for sample-holding an analog signal voltage, and initializes the voltage accumulated in the capacitor to a voltage that lies within an abnormality determining range prior to sample-holding the analog signal voltage in the capacitor. One of the voltages of the two points is used as the higher reference voltage (VREF+) of the reference voltages serving as a reference for the A/D conversion, the other voltage is used as the one in a state where the input is open, and the initialized voltage of the sample-holding capacitor is used as the lower reference voltage (VREF−) of the reference voltages serving as the references for the A/D conversion. Based upon the result of A/D conversion, abnormal linearity of the A/D converter is detected and bit-stuck abnormality (bit data is stuck to either 0 or 1 without indicating proper value) is detected in the conversion register in the A/D converter.

By using the initialized voltage of the input sample-holding capacitor as the lower reference voltage (REF−), the A/D-converted value in a state where the input is opened becomes the same as that of when the lower reference voltage (VREF−) is connected. By establishing a state where the input is opened, further, the detection is realized by adding a logic of a determining circuit constructed by the software of an ordinary microcomputer without requiring any particular circuit.

Preferably, the A/D converter has a capacitor for sample-holding an analog signal voltage, and initializes the voltage accumulated in the capacitor to a voltage that lies within an abnormality determining range prior to sample-holding the analog signal voltage in the capacitor. One of the voltages of the two points is used as the lower reference voltage (VREF−) of the reference voltages serving as the references for the A/D conversion, the other voltage is used as the one in an open state, and the voltage accumulated in the capacitor is used as the higher reference voltage (VREF+) of the reference voltages serving as the references for the A/D conversion. Based upon the result of A/D conversion, abnormal linearity of the A/D converter is detected and bit-stuck abnormality is detected in the conversion register in the A/D converter.

By using the initialized voltage of the input sample-holding capacitor as the higher reference voltage (REF+), the A/D-converted value in a state where the input is opened becomes the same as that of when the higher reference voltage (VREF+) is connected. By establishing a state where the input is opened, further, the detection is realized by adding a logic of a determining circuit constructed by the software of an ordinary microcomputer without requiring any particular circuit.

Preferably, corresponding numbers are imparted to the input terminals, one of the voltages of the two points is input to the input terminals that are all expressed by 0 by the binary notation, and the other voltage is input to the input terminals that are all expressed by 1 by the binary notation. In this construction, not only an abnormal condition is detected in the linearity of the A/D converter but also a bit-stuck abnormality is detected in the input channel selection signals input to the input channel selection SW circuit.

When, for example, six AD channels are required inclusive of the channels of the above two points, three bit lines are required for the input selection signals. Between the voltages of the two points, therefore, one voltage is set on a channel 0 (channel of the bit line of the input selection signal is 000) and the other voltage is set on a channel 7 (channel of the bit line of the input selection signal is 111). If an abnormality that the least significant bit of the channel selection signal input to the input channel selection SW circuit is stuck to 1, then, the channel 7 is normally selected and is normally A/D-converted.

However, the channel 0 is not normally selected but the channel 1 (channel of the bit line of the input selection signal is 001) is selected and is A/D-converted to detect an abnormal condition. Therefore, an abnormal condition is detected in the linearity of the A/D converter and a bit-stuck abnormality is detected in the input channel selection signals input to the input channel selection circuit.

A parity bit is used for the data communication to check whether any data is missing while transmitting the data. The parities include an even-number parity and an odd-number parity. By utilizing an even-number parity or an odd-number parity, the number of 1s in the data is counted, and the parity bits are transmitted such that the number becomes an even number or an odd number as specified. When, for example, the result of A/D conversion is "01110111" and an odd-number parity is used, the parity bit becomes "1" since the number of 1s is an odd number.

Therefore, an A/D-converted result "01110111" and a parity bit data "1" are stored in the converted result storage circuit. In this case, if a bit-stuck abnormality (0-stuck) occurs at the least significant bit of the converted result storage circuit, the content of the A/D-converted result in the converted result storage circuit becomes "01110110". Next, the A/D-converted result and the parity bit data are read out to be "01110110" and "1", respectively; i.e., the number of is becomes an odd number and a parity error occurs. Therefore, a bit-stuck abnormality is detected in the converted result storage circuit.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
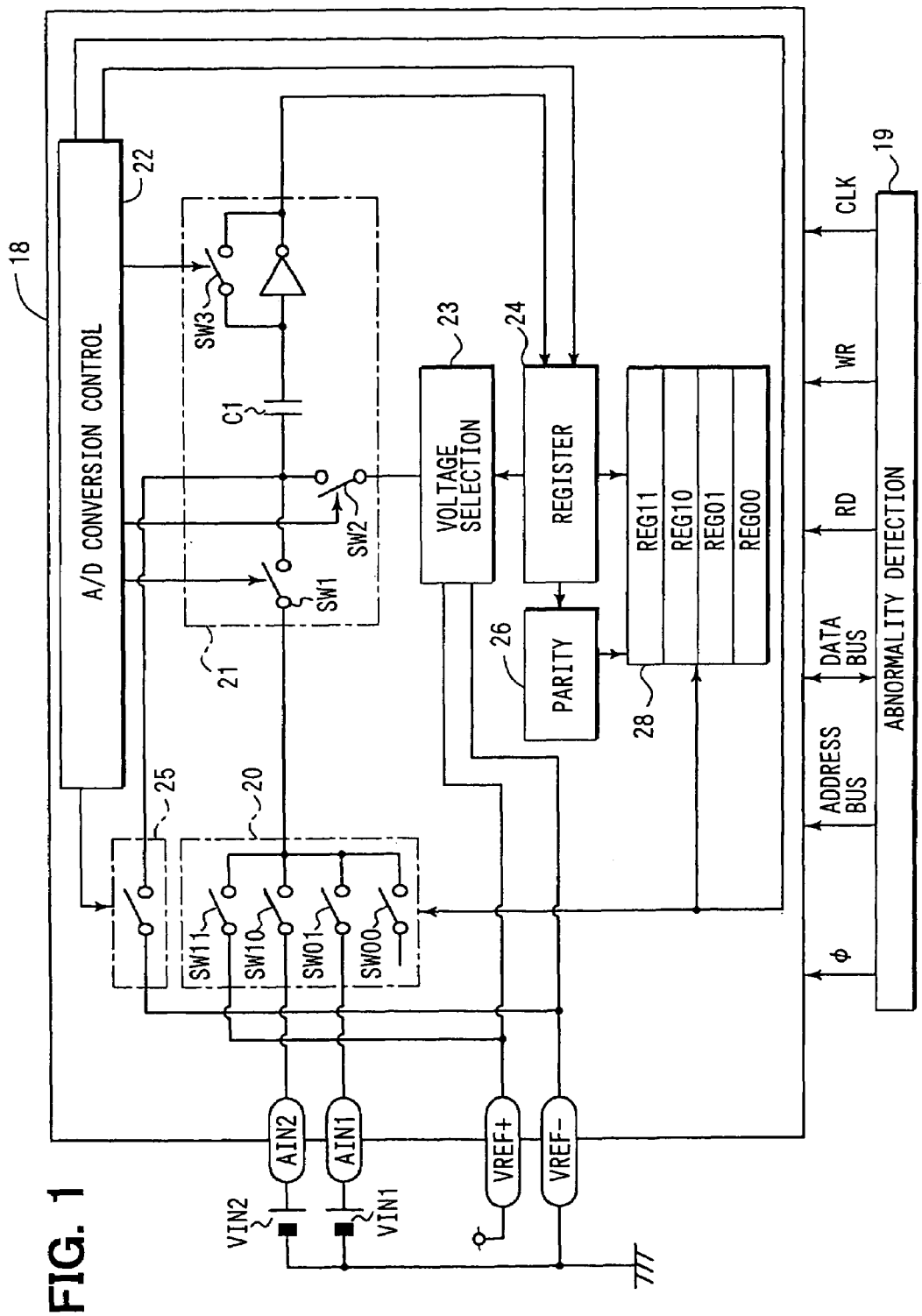
FIG. 1 is a block diagram illustrating an apparatus for detecting an A/D converter abnormality according to an embodiment of the invention.

An apparatus for detecting an abnormality of an A/D converter according to an embodiment is designated with reference numeral 18 in FIG. 1. For easy comprehension of the feature of this apparatus, reference is first made to FIG. 8, which is a block diagram of the A/D converter 18.

Figure 8:
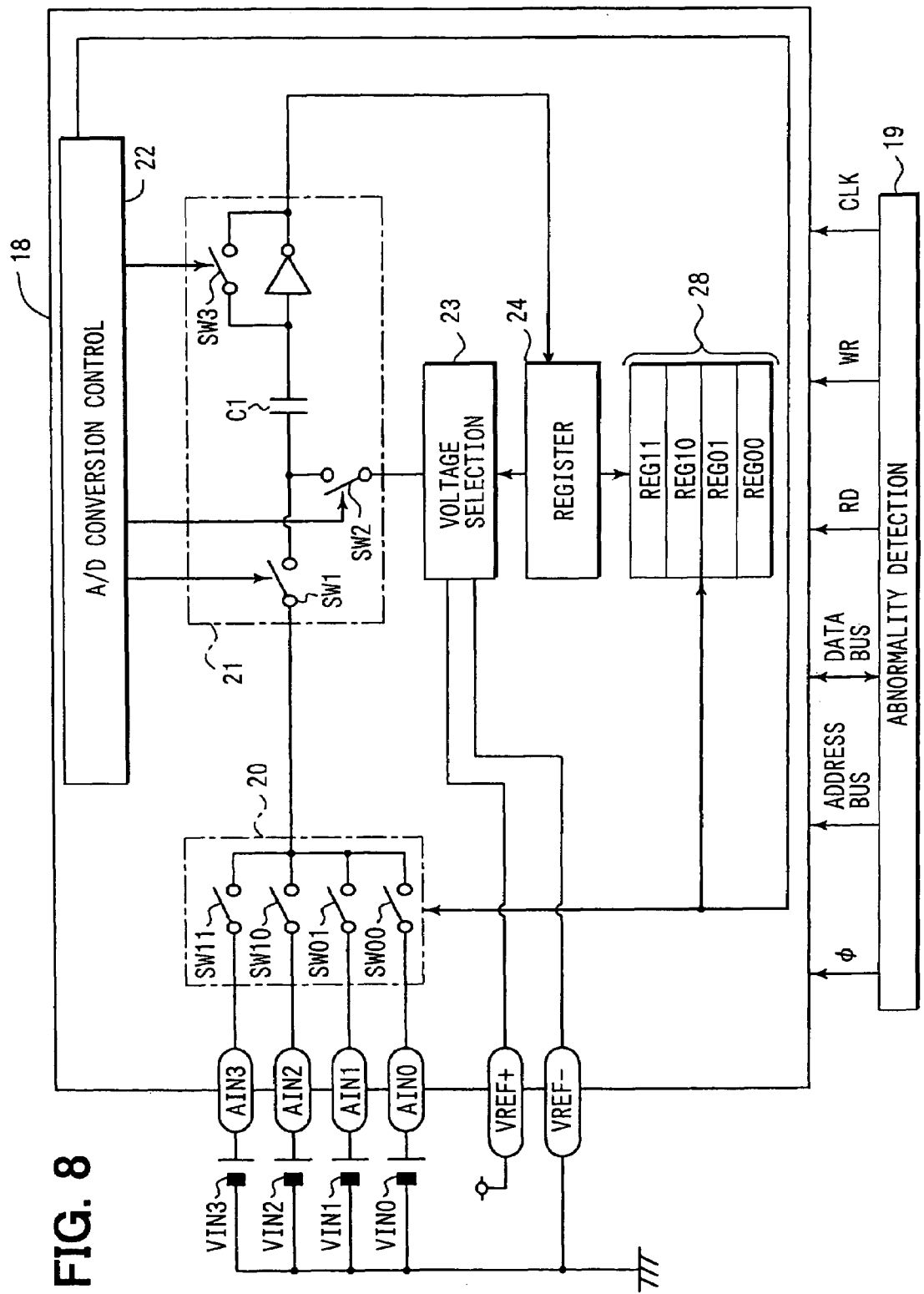
FIG. 8 is a block diagram illustrating an apparatus for detecting an A/D converter abnormality according to a prior art.

In FIG. 8, VIN0 to VIN3 are sensor inputs shown in place of the voltage sources. The sensor inputs are connected to terminals AIN0 to AIN3. The A/D converter 18 includes an input channel selection switch circuit 20, a comparator 21, an A/D conversion control circuit 22, a comparison reference voltage selection circuit 23, a conversion register circuit 24, and a register circuit 28 equipped with channel registers REG00 to REG11, and is connected to a abnormality detection apparatus 19 through an address bus that operates based on the clock signals φ, data bus, and RD (read request) and WR (rewrite request) signal lines. The A/D converter 18 operates based on the CLK (clock) signals fed from the abnormality detection apparatus 19.

The abnormality detection apparatus 19 is constructed as an ordinary microcomputer and includes well-known CPU, ROM, RAM, input/output circuit, which are not shown, and a bus line for connecting them. The CPU executes the abnormality detection operation based on a program and data stored in the ROM and RAM. The data are read out from the A/D converter 18, and abnormal condition in the A/D converter 18 is determined according to abnormality detection programs stored in the abnormality detection apparatus 19.

Next, A/D conversion processing will be described with reference to a case that VIN2 is input. The A/D converter 18 periodically selects the input channels in order of Ch0 (SW00), Ch1 (SW01), Ch2 (SW10), Ch3 (SW11) to put the input channels to the A/D conversion. When, for example, Ch2 is selected, SW10, SW1 and SW3 are closed, and an electric charge corresponding to a value of VIN2 is accumulated in the sample-holding (S/H) capacitor C1. After the electric charge is accumulated, SW1 and SW3 are opened, and SW2 is closed to effect the A/D conversion.

A comparison reference voltage selection circuit 23 forms a comparison reference voltage based on a higher reference voltage VREF+ and a lower reference voltage VREF−, and the comparator 21 compares the accumulated voltage VIN2 with the comparison reference voltage. The comparison results are successively held in the conversion register circuit 24. At a moment when VIN2 is in agreement with the comparison reference voltage, the value held in the conversion register circuit 24 is stored as an A/D-converted value in the channel register REG10 of the register circuit 28. Thereafter, SW10 and SW2 are opened. These processes are controlled by the A/D conversion control circuit 22.

Figure 9:
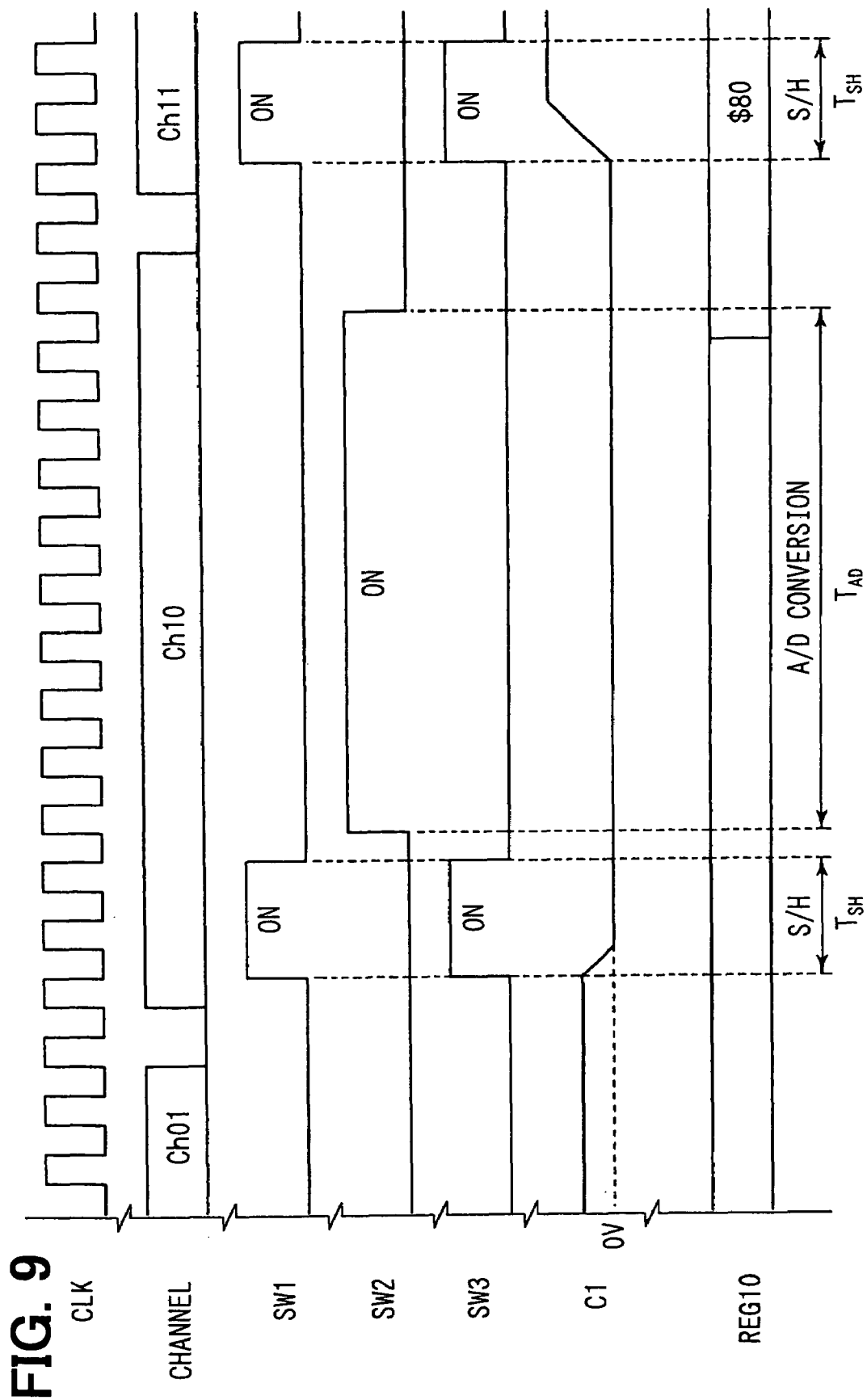
FIG. 9 is a timing chart for illustrating the operations of the switches at the time of A/D conversion according to the prior art.

FIG. 9 is a timing chart illustrating the above A/D conversion processing. When the input channel Ch10 (=Ch2) is selected, a state where SW1 and SW3 are closed (ON) is a S/H period $T_{SH}$. This period is set to such a length that an electric charge corresponding to the input voltage can be accumulated in the capacitor C1. Further, a period in which SW1 and SW3 are opened (OFF) and SW2 is closed (ON), is an A/D conversion period $T_{AD}$. When the A/D conversion processing ends and SW2 becomes open, a converted result ($80 in the example of FIG. 9; $ means a hexadecimal number) is stored in the channel register REG10. The periods such as $T_{SH}$ and $T_{AD}$ and the timings for opening/closing the switches are formed based on the CLK signals.

Figure 10:
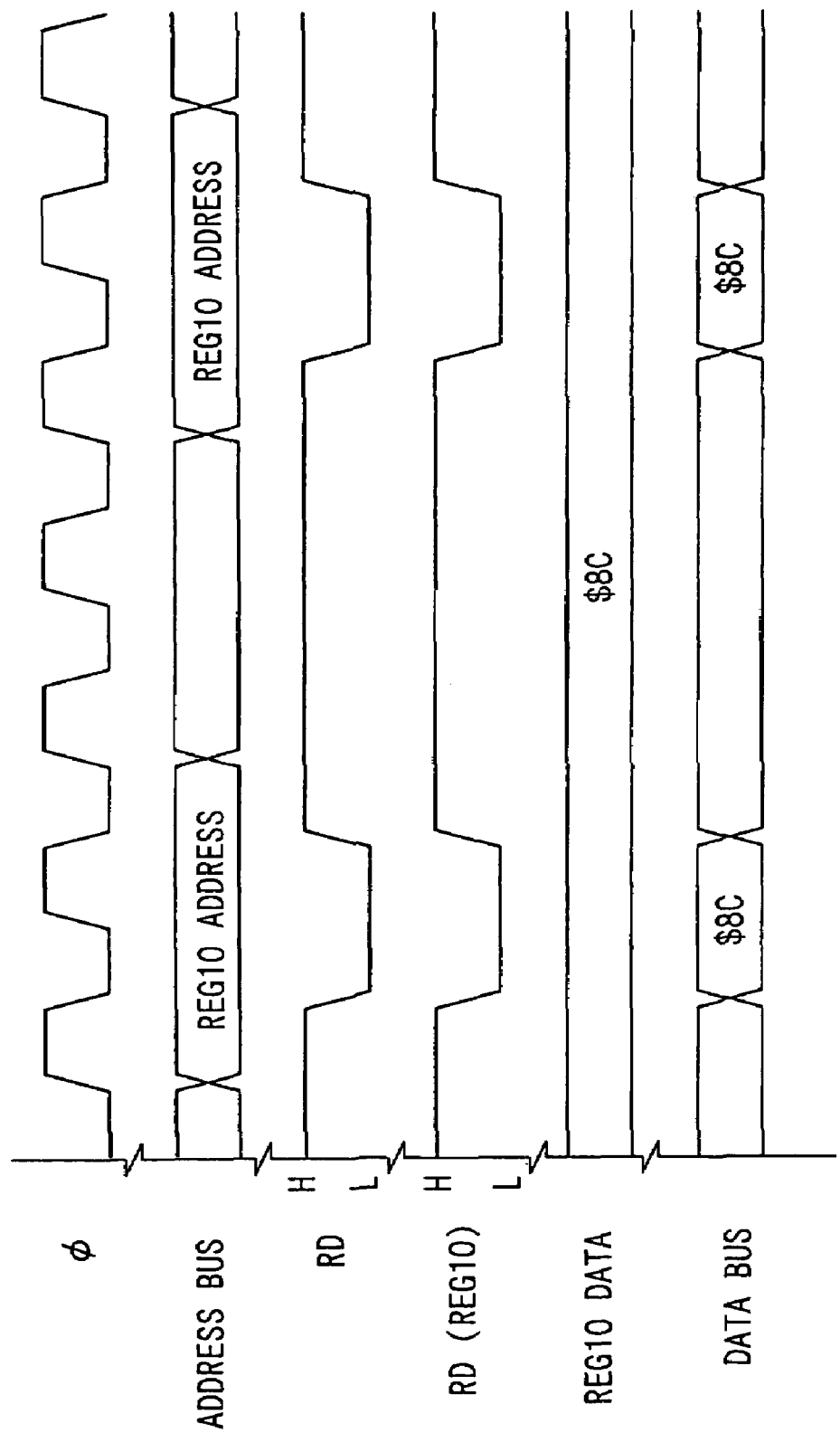
FIG. 10 is a timing chart for illustrating the data transmission at the time of A/D conversion according to the prior art.
Figure 11:
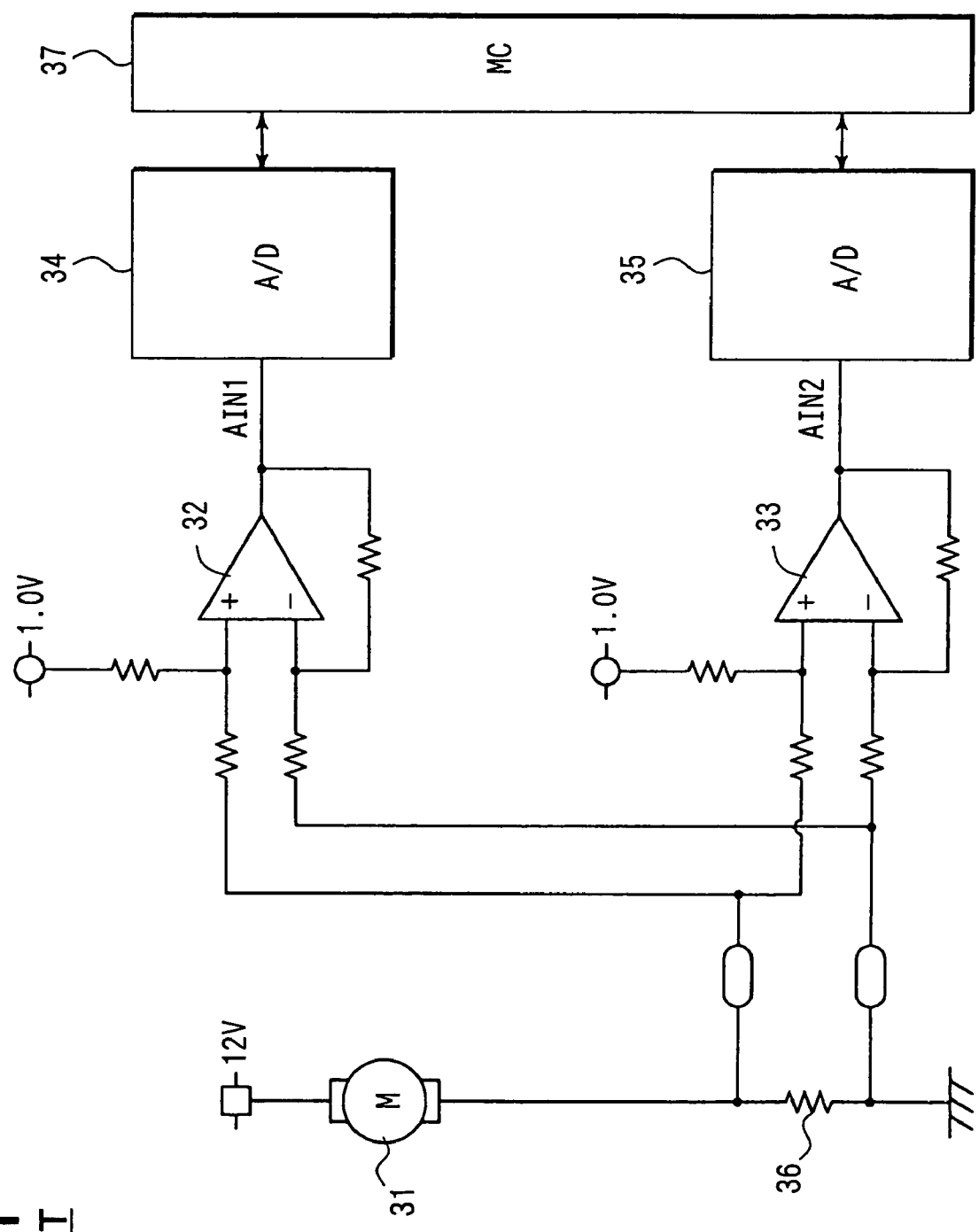
FIG. 11 is a diagram illustrating a prior art using an A/D converter.

FIG. 10 is a timing chart illustrating the states of related signals at the time when the abnormality detection apparatus 19 reads the result of the A/D conversion. Clock signals φ serve as a reference of a reading timing. The abnormality detection apparatus 19 specifies the channel register (channel register REG10=Ch2 in the example of FIG. 10) to the address bus so that the RD signal assumes the L level for a predetermined period of time. Upon receipt of a reading request by these signals, the A/D converter 18 produces a channel register read signal of the L level for a predetermined period of time for the corresponding channel register (channel register REG10 in the example of FIG. 10), reads the content ($8C in the example of FIG. 10) of the corresponding channel register, and sends it to the abnormality detection apparatus 19 via the data bus.

The abnormality detection apparatus 19 determines whether the data are normal based on the A/D-converted data sent from the A/D converter 18.

Reference is next made to FIG. 1. The A/D converter 18 is similar to the A/D converter 18 illustrated in FIG. 8 except that some circuits are added and some modifications are made as described below. Some circuits, which also form a part of the abnormality detection apparatus 19, are shown in the A/D converter 18.

In the A/D converter 18 shown in FIG. 1, the analog signal inputs are in two systems of AIN1 and AIN2, the input (AIN0 of FIG. 8) of the input Ch0 is open, the input (AIN3 of FIG. 8) of input Ch3 is connected to VREF+, which forms an abnormality detecting voltage. There are added capacitor initializing switch 25 and a parity calculation circuit 26.

Figure 2:
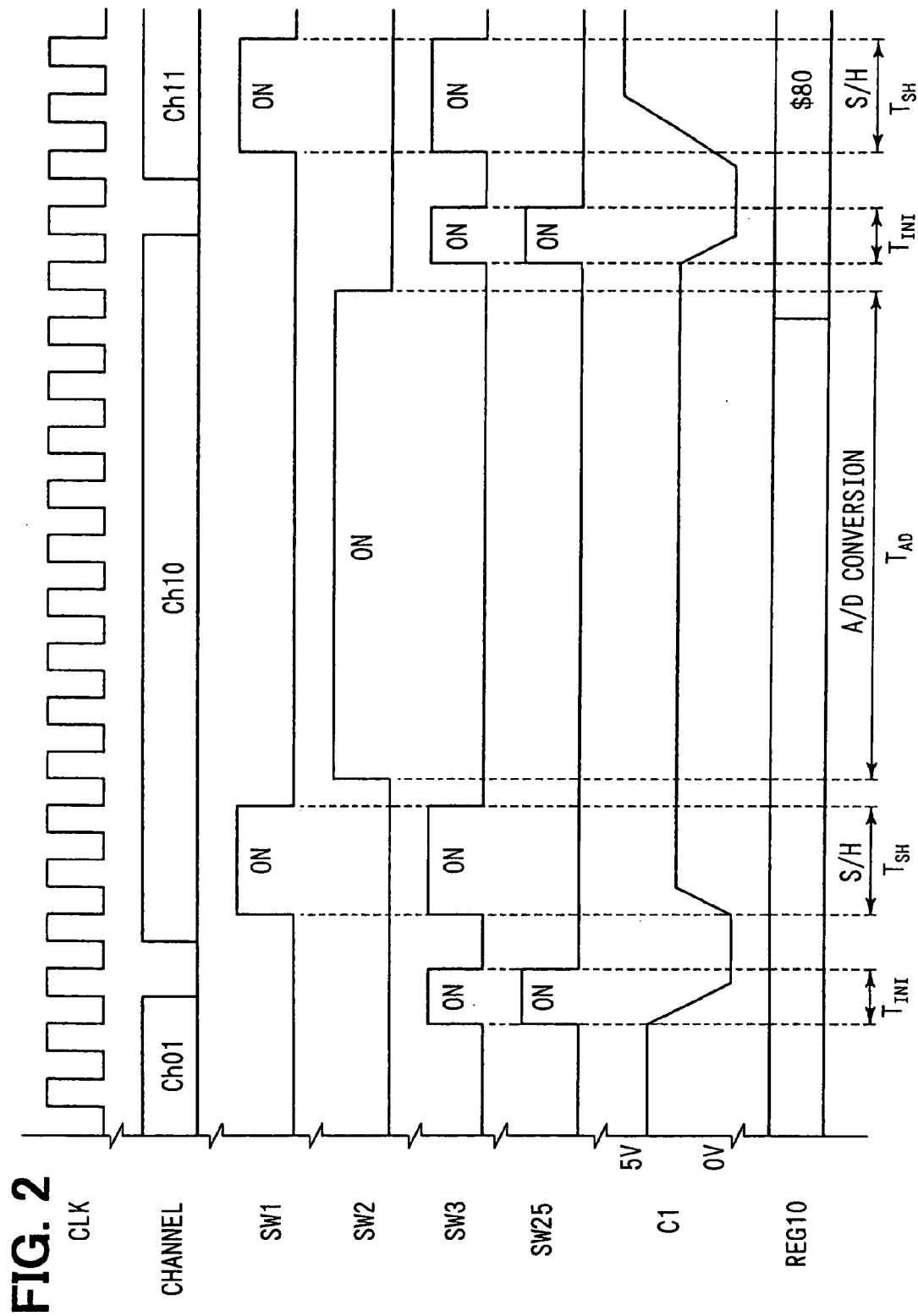
FIG. 2 is a timing chart illustrating the operations of switches at the time of A/D conversion.

FIG. 2 is a timing chart illustrating the A/D conversion processing of the embodiment shown in FIG. 1. FIG. 2 is different from FIG. 9 in that an initializing period $T_{INI}$ is added.

In FIG. 1, when the conversion of AIN1 (Ch01) ends with all switches (SW00, SW01, SW10, SW11) being open, the capacitor initializing switch 25 and SW3 are closed to initialize the capacitor C1. The voltage of the capacitor C1 becomes the lower reference voltage VREF− (0 V). After the end of initialization of the capacitor C1, the capacitor initializing switch 25 and SW3 are opened to select the AIN2 (Ch10).

When the AIN2 (Ch10) is selected, the SW10, SW1 and SW3 are closed so that an electric charge corresponding the value of VIN2 is accumulated in the capacitor C1. After the electric charge is accumulated, the SW1 and SW3 are opened and SW2 is closed to effect the A/D conversion. The comparison reference voltage selection circuit 23 forms a comparison reference voltage based on the higher reference voltage VREF+ and the lower reference voltage VREF−, and the comparator 21 compares the voltage VIN with the comparison reference voltage. The comparison results are successively stored in the conversion register circuit 24.

At a moment when VIN2 becomes in agreement with the comparison reference voltage, the value held in the conversion register circuit 24 is stored as an A/D-converted value in the channel register REG10 of the register circuit (conversion result storage circuit) 28. Thereafter, SW10 and SW2 are opened. These processing are controlled by the A/D conversion control circuit 22.

Thereafter, the capacitor initializing switch 25 and SW3 are closed again to initialize the capacitor C1. When the initialization of the S/H capacitor C1 ends, the capacitor initializing switch 25 and SW3 are opened to select the next channel. The A/D conversion of the next channel is effected.

Referring to FIG. 2, the initializing period $T_{INI}$ is provided prior to selecting the channel. Thereafter, the channel is selected, and the S/H period $T_{SH}$ and the A/D conversion period $T_{AD}$ are set like in the A/D conversion processing of FIG. 8. The construction in other respects and the method of forming timings are the same as those of the conventional A/D conversion processing.

States of the related signals at the time of reading the A/D-converted result by the abnormality detection apparatus 19 are the same as those of FIG. 10. The abnormality detection apparatus 19 operates as voltage range setting means, storage means, abnormality detecting means, the ideal value storage means, setting means and calculation means. Further, VIN1 and VIN2 correspond to input means.

When the A/D conversion is effected in the above state without selecting the next channel, the electric charge accumulated in the capacitor C1 becomes the electric charge of when the capacitor is initialized, i.e., becomes a result of when VREF− (0 V) is put to the A/D conversion. When important sensor inputs are to be put to the A/D conversion, in general, the effective values of input voltages (VIN1, VIN2) from the sensors are normally in a range of 0% to 90% of the reference voltage. Other values outside the range (0% to 90%) are regarded to be abnormal values such as of breakage of line or short circuit.

If the reference voltage is 5 V (higher reference voltage VREF+ is 5 V, lower reference voltage is 0 V), the effective value of the input voltage from the sensors is in a range of 0.5 V to 4.5 V, and other values (i.e., values smaller than 0.5 V or values greater than 4.5 V) are determined to be outputs from abnormal sensors. When the channel is selected and the input from the channel is normal (e.g., 3 V), an electric charge corresponding to 3 V is accumulated in the capacitor C1 and is put to the A/D conversion, making it possible to obtain an A/D-converted result of 3 V.

However, when the capacitor C is abnormal or when the input system from the sensor is broken, no electric charge is accumulated in the capacitor C1. Therefore, the electric charge accumulated in the capacitor C1 at this moment remains zero which is a state where the capacitor C1 is initialized. Therefore, if the A/D conversion is effected at this moment, there is obtained the converted result of 0 V, from which the abnormality detection apparatus 19 determines that the A/D converter is abnormal.

Even when the initialized voltage of the capacitor C1 is the higher reference voltage VREF+ (abnormality detecting voltage forming means), i.e., one end of the capacitor initializing switch 25 is connected to VREF+ (5 V), the VREF+ (5 V) lies in the range of abnormal voltages. Therefore, if the capacitor C1 is abnormal or if the input system from the sensor is broken, the abnormality detection apparatus 19 determines that the A/D converter 18 is abnormal in the same manner as described above.

When the input of analog signal is opened as in SW00 in FIG. 1, the potential of SW1 on the side of the capacitor C1 becomes the voltage of when the capacitor C1 is initialized. Namely, the same state as that of when VREF− (0 V) is connected is established. In this case, therefore, if the capacitor C1 is initialized to effect the A/D conversion, the converted result becomes 0 V which is in the range of abnormal voltages. If the capacitor C1 is abnormal or if the input system from the sensor is broken, the abnormality detection apparatus 19 determines that the A/D converter is abnormal in the same manner as described above.

Further, the abnormality detection apparatus 19 reads the converted result as a predetermined given voltage (e.g., 2.5 V) formed from a stabilized power source different from a stabilized power source in which one input such as VIN1 of the A/D converter is connected to the AD power source (5 V) or to the reference voltage (VREF+, VREEF−) fed to the A/D converter. The abnormality detection apparatus 19 compares the converted result with an estimated converted result of the given voltage stored in the storage circuit such as ROM (not shown) in the abnormality detection apparatus 19.

When a difference is greater than a predetermined value, the processing is executed to determine that the data is abnormal. In the same manner as described above, therefore, the abnormality detection apparatus 19 determines that the AD power source voltage, the comparator voltage selection circuit including the reference voltage, and VIN1 are abnormal.

Further, the A/D converter 18 with the abnormality detecting function of FIG. 1 is incorporated in a microcomputer that operates on a plurality of power sources. One input of the A/D converter, e.g., VIN1 is connected in the microcomputer to a power source (e.g., 2.5 V of core power source) connected to a stabilized power source different from the AD power source voltage fed to the A/D converter or the stabilized power source connected to the reference voltage (VREF+, VREF−). The converted result is read by the abnormality detection apparatus 19 and is compared with an estimated converted result of the given voltage stored in a storage circuit such as ROM (not shown) in the abnormality detection apparatus 19.

When the difference is greater than a predetermined value, the processing is executed to determine that the data is abnormal. Without requiring any particular circuit, therefore, the abnormality detection apparatus 19 can determine that the AD power source voltage, the comparator voltage selection circuit including the reference voltage, and VIN1 are abnormal in the same manner as described above. (Data Check Processing at the Time of A/D Conversion)

The data check processing at the time of A/D conversion will be described with reference to FIG. 3. This processing is periodically executed by the CPU of the abnormality detection apparatus 19. The CPU is programmed to execute the following processing.

It first checks whether the A/D conversion itself is properly executed concerning the specified channel as described above in compliance with the instruction from the abnormality detection apparatus 19 (S1 to S4) and determines whether the content of the result of A/D conversion is abnormal (S5 to S8). Finally, when the result of A/D conversion is normal, processing is executed for determining the linearity of the result of A/D conversion (S9).

Figure 3:
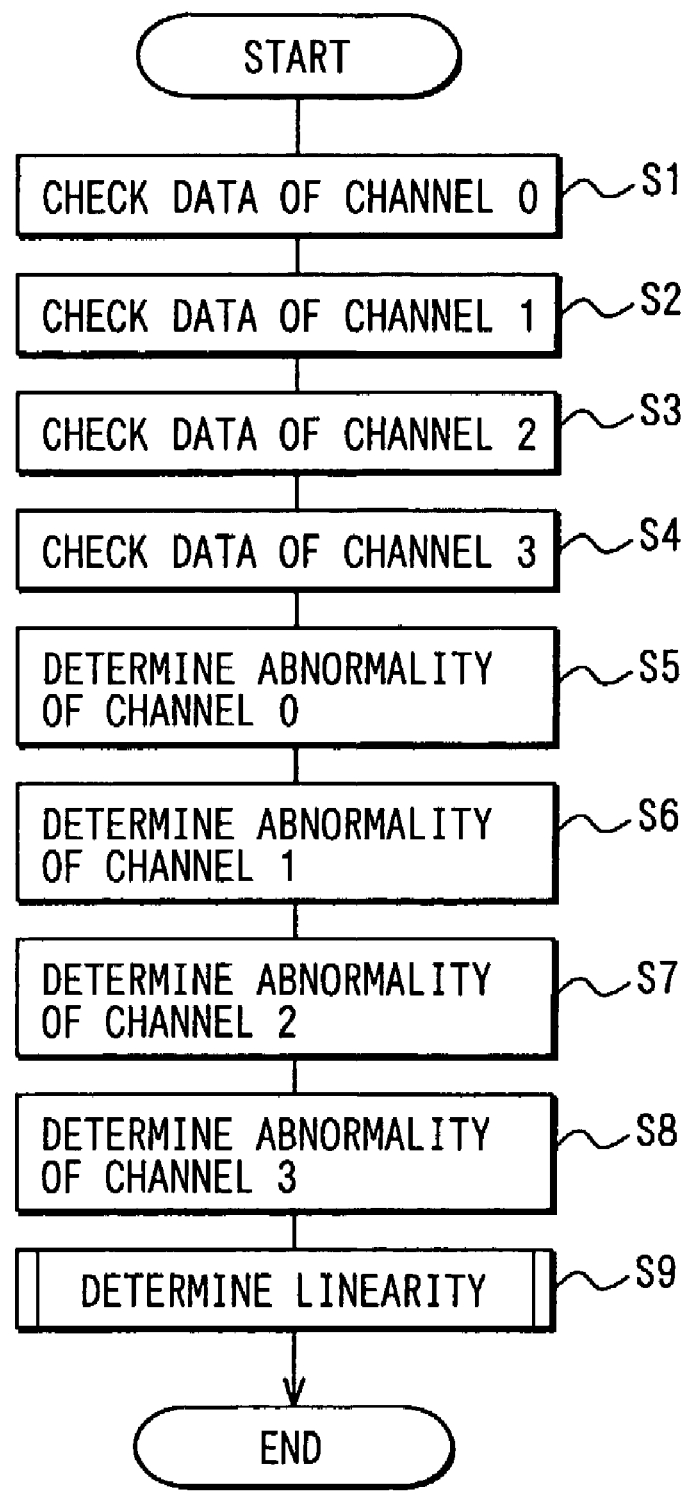
FIG. 3 is a flowchart illustrating A/D conversion processing.

Referring to FIG. 3, the A/D conversion may be effected at one time in the order of Ch0 (SW00 in FIG. 1), Ch1 (SW01), Ch2 (SW10), and Ch3 (SW11) by successively receiving the input data. Alternatively, the A/D conversion may be effected for one channel for each period of the data check processing.

The data check processing at the time of A/D conversion will now be described in detail with reference to FIG. 4. This processing corresponds to the processing at steps S1 to S4 of FIG. 3, and is executed by the CPU of the abnormality detection apparatus 19. First, a channel is specified for the A/D converter 18 to start the A/D conversion (S11). A standby state (S12) lasts until an A/D conversion end data is obtained from the A/D converter 18. When the A/D conversion end data is not obtained within a predetermined period of time (S17: Yes), an A/D conversion data abnormality flag is set to end the processing (S18).

On the other hand, when the A/D conversion end data is obtained from the A/D converter 18 within a predetermined period of time (S12: Yes), the A/D conversion data is stored in the corresponding storage register 28 by the method described earlier. Therefore, the abnormality detection apparatus 19 requests the A/D converter 18 to send the A/D conversion data.

Upon receipt of the request for transmitting the A/D conversion data from the abnormality detection apparatus 19, the A/D converter 18 reads the A/D-converted data of the corresponding channel from the storage register 28 and sends it to the abnormality detection apparatus 19 (S13). Then a parity check, which will be described later, is executed (S14).

The abnormality detection apparatus 19 determines whether the A/D-converted data received from the A/D converter 18 are normal, i.e., whether the A/D-converted data is 0 V for the open terminal of Ch0 (SW00), whether the A/D-converted data are corresponding to voltages in a range of 0.5 V to 4.5 V for the channels of important sensor inputs of Ch1 (SW01) and Ch2 (SW10), and whether the A/D-converted data is 5 V for Ch3 (SW111). When the A/D-converted data is abnormal (S15: No), the A/D-converted data abnormality flag is set to end the processing (S18). When the A/D-converted data is normal (S15: Yes), the A/D-converted data abnormality flag is cleared to end the processing (S16).

Figure 5:
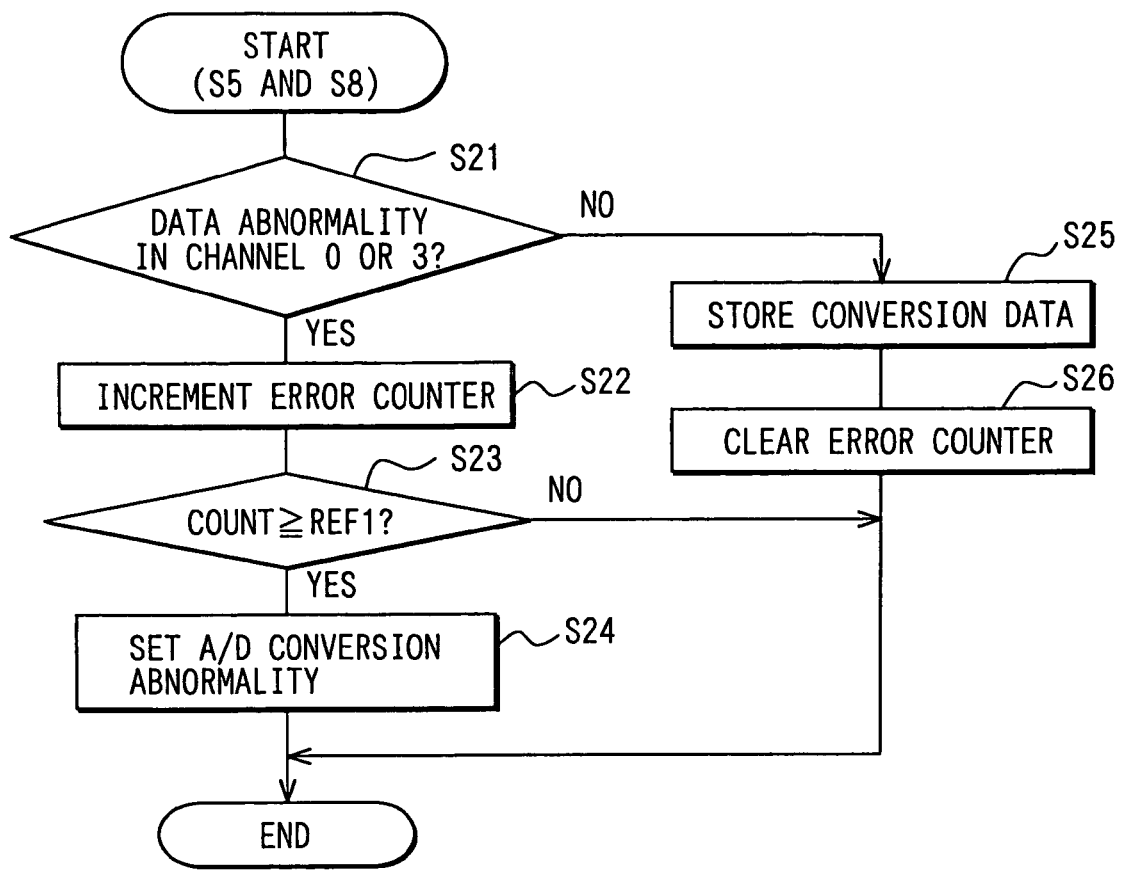
FIG. 5 is a flowchart illustrating processing for determining abnormal A/D conversion.

The abnormality determination processing for Ch0 (SW00) and Ch3 (SW11), which corresponds to steps S5 and S8 of FIG. 3, is shown in FIG. 5, and executed for each channel by the CPU of the abnormality detection apparatus 19.

When the A/D conversion data abnormality flag indicating data abnormality has not been set (S21: No), the A/D-converted data of the channel is stored in a predetermined storage region (S25), and the error determination counter is cleared to zero (S26) to end the processing. When the A/D-converted data abnormality flag has been set (S21: Yes), on the other hand, the error determination counter is updated or incremented (S22). Next, it is determined if the error determination counter exceeds a predetermined reference value REF1.

If the error determination counter does not exceed the predetermined reference value REF1 (S23: No), the processing ends without doing anything. If the error determination counter exceeds the predetermined value (S23: Yes), the A/D conversion abnormality determination flag is set and the error determination counter is cleared to zero (S24) to end the processing.

Figure 6:
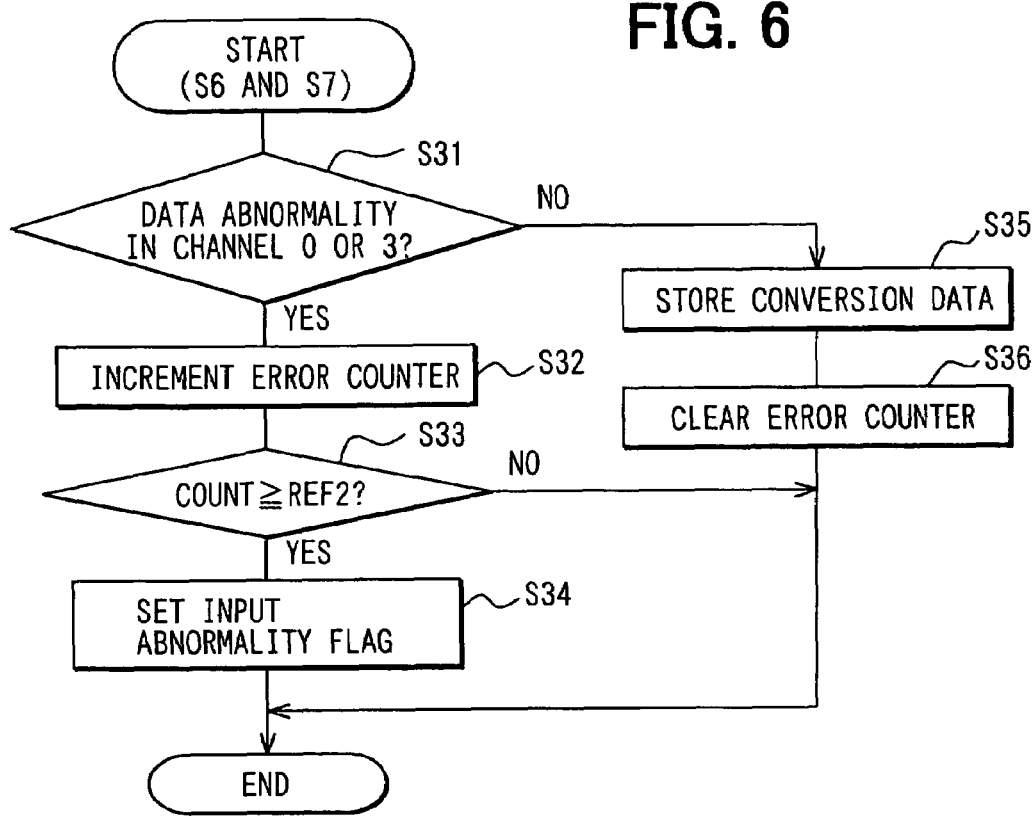
FIG. 6 is a flowchart illustrating processing for determining abnormal condition in an input system.

The abnormality determination processing for Ch1 (SW01) and Ch2 (SW10), which corresponds to steps S6 and S7 of FIG. 3, is shown in FIG. 6, and executed for each channel by the CPU of the abnormality detection apparatus 19. As shown in FIG. 1, the channel 1 and the channel 2 are connected to sensors.

When the A/D conversion data abnormality flag has not been set (S31: No), the A/D-converted data is stored in the predetermined storage region (S35), and the error determination counter is cleared to zero (S36) to end the processing. When the A/D-converted data abnormality flag has been set (S31: Yes), on the other hand, the error determination counter is updated or incremented (S32). Next, it is determined if the error determination counter exceeds a predetermined value REF2.

If the error determination counter does not exceed the predetermined reference value REF2 (S33: No), the processing ends without doing anything. If the error determination counter exceeds the predetermined reference value REF2 (S33: Yes), the A/D conversion abnormality determination flag is set and the error determination counter is cleared to zero (S34) to end the processing. (Detection of Abnormal Linearity of the A/D Converter)

Figure 7:
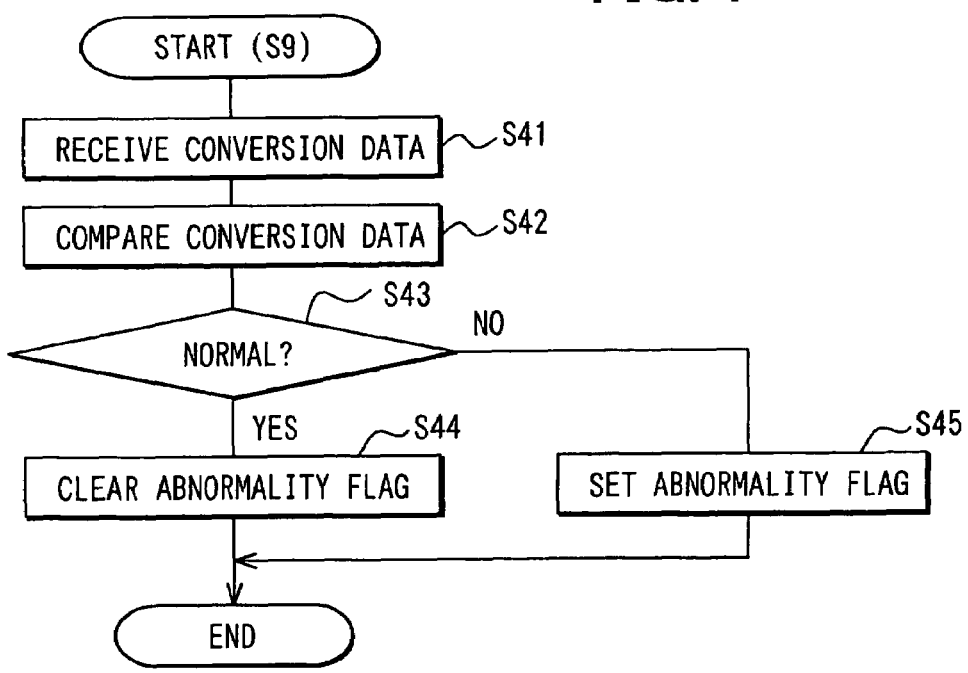
FIG. 7 is a flowchart illustrating processing for determining abnormal linearity.

The abnormal linearity of the A/D converter is detected by setting voltages of at least two predetermined points, and based on the A/D-converted results of the voltages at the two points. This processing corresponds to S9 in FIG. 3 and is executed by the CPU of the abnormality detection apparatus 19. FIG. 7 is a flowchart illustrating the above processing in detail.

When the A/D conversion ends, the abnormality detection apparatus 19 requests the A/D converter 18 to transmit the A/D-converted data, and receives the contents of the checking channel register 00 (A/D-converted result of SW00) and of the checking channel register 11 (A/D-converted result of SW11) in the storage register 28 (S41).

The abnormality detection apparatus 19 determines abnormal linearity by comparing the two A/D-converted data received from the A/D converter 18 (S42). When a predetermined abnormality is detected (S43: No), the A/D-converted data abnormality flag is set to end the processing (S45). When the A/D-converted data is normal (S43: Yes), the A/D-converted data abnormality flag is cleared to end the processing (S44).

The abnormality of linearity, which is checked at step S42, may be determined in various ways in the following manner.

(1) The input voltage of SW00 of FIG. 1 is presumed to be 2 V, and the input voltage of SW11 is presumed to be 3 V. If the converted data formed in the conversion register has 8 bits, the input voltages are put to the A/D conversion to obtain A/D-converted results of $66 and $99 (expressed by the hexadecimal notation). These values are stored in the storage circuit such as ROM (not shown) in the abnormality detection apparatus 19. The SW00 and SW11 are put to the A/D conversion at regular intervals, and the results thereof are compared with the stored values.

When at least either one of the converted results of SW00 and SW11 is different from the stored values by more than a predetermined value, it is so determined that the linearly of the A/D converter is abnormal.

(2) The input voltage of SW00 of FIG. 1 is presumed to be a given an a log voltage, and the input voltage of SW11 is presumed to be the one obtained by multiplying the input voltage of SW00 by a predetermined magnification (e.g., 2 times). If the input voltage of SW00 at a given moment of A/D conversion is 2 V, the input voltage of SW11 becomes 4 V which is two times the input voltage of SW00. If they are put to the A/D conversion, there are obtained the A/D-converted results of $66 and $CC (expressed by the hexadecimal notation). Since $CC=$66×2, there holds a relationship in that the A/D-converted result of SW11 is twice the A/D-converted result of SW00 even in the result of A/D conversion.

When the result of A/D conversion of SW11 is not twice the result of A/D conversion of SW00, and neither inputs exceed the range of input voltages of the A/D converter, it is determined by utilizing the above relationship that the linearity of the A/D converter is abnormal.

(3) The input voltage of SW00 of FIG. 1 is presumed to be a given an a log voltage, and the input voltage of SW11 is presumed to be the one obtained by adding a predetermined offset (e.g., 0.5 V) to the input voltage of SW00. If the input voltage of SW00 at a given moment of A/D conversion is 2 V, the input voltage of SW11 becomes 2.5 V by adding the offset amount of 0.5 V to the input voltage of SW00.

If they are put to the A/D conversion, there are obtained $66 and $80 (expressed by the hexadecimal notation), respectively. Here, $80=$66+$1A, and $1A corresponds to the offset amount of 0.5 V. Therefore, there holds a relationship in that the A/D-converted result of SW11 is the one obtained by adding the offset amount to the A/D-converted result of SW00 even in the result of A/D conversion.

When the result of A/D conversion of SW11 is not the value obtained by adding the offset amount of 0.5 V to the result of A/D conversion of SW00, and neither inputs exceed the range of input voltages of the A/D converter, it is determined by utilizing the above relationship that the linearity of the A/D converter is abnormal.

(4) The input voltage of SW00 of FIG. 1 is presumed to be a given an a log voltage, and the input voltage of SW11 is presumed to be the one obtained by multiplying the input voltage of SW00 by a predetermined magnification (e.g., 2 times) and adding a predetermined offset (e.g., 0.5V) thereto. If the input voltage of SW00 at a given moment of A/D conversion is 2 V, the input voltage of SW11 becomes 4.5 V which is obtained by doubling the input voltage of SW00 and adding the offset amount of 0.5V thereto. If they are put to the A/D conversion, there are obtained the A/D-converted results of $66 and $CC (expressed by the hexadecimal notation). Since $E6=$66×2+$1A, there holds a relationship in that the A/D-converted result of SW11 is the one obtained by doubling the A/D-converted result of SW00 and adding the offset amount thereto even in the result of A/D conversion.

When the result of A/D conversion of SW11 is not the one obtained by doubling the A/D-converted result of SW00 and adding the offset amount of 0.5 V thereto, and neither inputs exceed the range of input voltages of the A/D converter, it is determined by utilizing the above relationship that the linearity of the A/D converter is abnormal.

(5) It is assumed that the input of SW00 of FIG. 1 is opened, the input voltage of SW11 is set to be 4 V, and the inputs of SW00 and SW11 are put to the A/D conversion. Since SW00 is opened, its input becomes equal to the case when the initialized voltage 0 V of the capacitor is input. Therefore, there are obtained the A/D-converted results of $00 and $CC (expressed by the hexadecimal notation). Since the input 0 V is in the range of abnormal voltages, the A/D conversion of SW00 makes it possible to detect abnormal initialization function of the capacitor C1 or to detect on-stuck abnormality (close-stuck abnormality) of SW in the input channel selection SW circuit. In addition, abnormal linearity of the A/D converter can also be detected from the input voltages at the two points as described earlier.

(6) If the input voltage of SW00 of FIG. 1 is 2 V, the input voltage of SW11 is a predetermined voltage of 3 V obtained from a power source system other than the power source of the A/D converter or the power source connected to the reference voltage, and these inputs are put to the A/D conversion. Then, there will be obtained the A/D-converted results of $66 and $99 (expressed by the hexadecimal notation).

In case that only the A/D-converted result of SW11 is abnormal, however, it can be so determined that one or more of abnormalities occur, that is, the reference voltages of the A/D converter or the power source voltage are abnormal, input voltage of SW11 is abnormal, or linearity is abnormal. As described above, abnormal condition in the reference voltage and in the AD power source voltage can be detected in addition to detecting abnormal linearity of the A/D converter.

(7) If the input voltage of SW00 of FIG. 1 is VREF− (0 V), the input voltage of SW11 is VREF+ (5 V), and these inputs are put to the A/D conversion, then, there will be obtained the A/D-converted results of $00 and $FF (expressed by the hexadecimal notation). In case that a bit sticks in the conversion register circuit 24, however, a different result of conversion is obtained. For example, if the least significant bit in the conversion register circuit 24 is stuck to 0, the A/D-converted results of SW00 and SW11 are, respectively, $00 (normal) and $FE (abnormal).

If the least significant bit is stuck to 1, the A/D-converted results of SW00 and SW11 are, respectively, $01 (abnormal) and $FF (normal). As described above, a bit-stuck abnormality in the conversion register circuit 24 can be detected in addition to detecting abnormal linearity of the A/D converter.

(8) If the initialized voltage of the capacitor of FIG. 1 is VREF− (0 V), the input voltage of SW00 is opened, the input voltage of SW11 is VREF+ (5 V), and these inputs are put to the A/D conversion, then, the converted result of SW00 becomes the voltage of when the capacitor is initialized, i.e., becomes equivalent to the case when VREF− (0 V) is converted. If they are put to the A/D conversion, the results of A/D conversion become $00 and $FF (expressed by the hexadecimal notation). Like the above construction, therefore, a bit-stuck abnormality in the conversion register circuit 24 can be detected in addition to detecting abnormal linearity of the A/D converter.

(9) If the initialized voltage of the capacitor of FIG. 1 is VREF+ (5 V), the input voltage of SW00 is VREF− (0 V), the input voltage of SW11 is opened, and these inputs are put to the A/D conversion, then, the converted result of SW11 becomes the voltage of when the capacitor is initialized, i.e., becomes equivalent to the case when VREF+ (5 V) is converted. If they are put to the A/D conversion, the results of A/D conversion become $00 and $FF (expressed by the hexadecimal notation). Like in the above construction, therefore, a bit-stuck abnormality in the conversion register circuit 24 can be detected in addition to detecting abnormal linearity of the A/D converter.

(10) Two input voltages having a distinct relationship, such as, 0 V and 5 V are input to the channel No. 0 (SW00) and to the channel No. 3 (SW11) among the four input channels of the A/D converter of FIG. 1, and are put to the A/D conversion to obtain A/D-converted results of $00 and $FF (expressed by the hexadecimal notation), respectively. Here, if a signal level-stuck abnormality occurs on a bit line of an input channel selection signal input to the input channel selection circuit, either one of the above two A/D-converted results assumes a different value. For example, if the least significant bit line of the input channel selection signal is stuck to 0, SW10 is put to the A/D conversion at the time of AD-converting SW11. This data becomes the result of A/D conversion.

Similarly, if the most significant bit line of the input channel selection signal is stuck to 1, SW10 is put to the A/D conversion at the time of AD-converting SW00. This data becomes the result of A/D conversion. As described above, an abnormality of signal level that is stuck to the bit line of the input channel selection signal input to the input channel selection circuit can be detected in addition to detecting abnormal linearity of the A/D converter.

Figure 4:
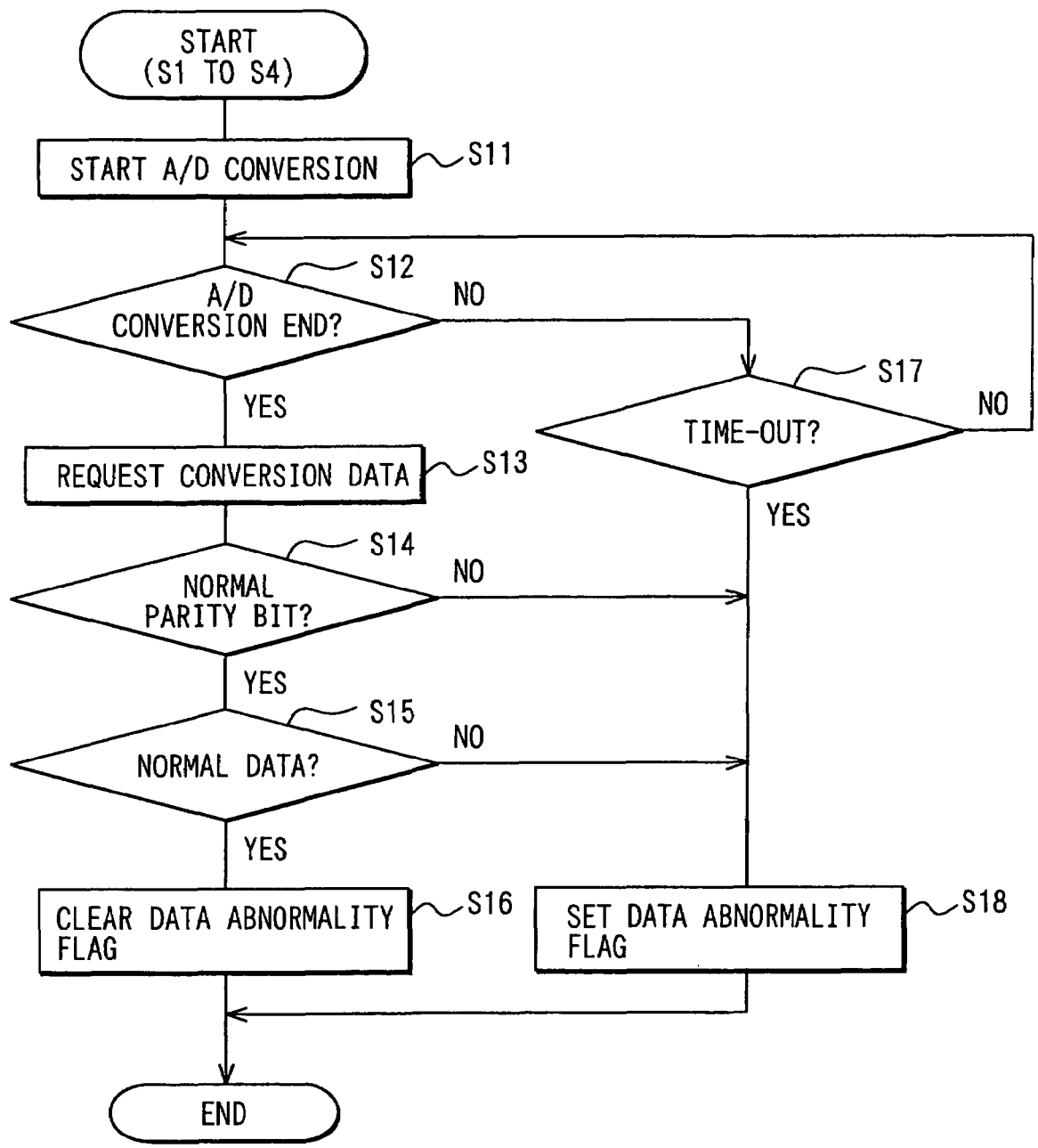
FIG. 4 is a flowchart illustrating processing for determining abnormal data at the time of A/D conversion.

In FIGS. 1 and 4, at the end of the A/D conversion, a parity bit is formed from the A/D-converted data and both data are stored in the corresponding region of the storage register 28. This embodiment employs an odd-number parity. The odd-number parity is the one in which parity bits are so set that the number of "1s" in the bit string of data being transmitted becomes an odd number. The parity bits are set by the parity calculation circuit 26 in the A/D converter 18.

Upon receipt of a request for sending A/D-converted data from the abnormality detection apparatus 19, the A/D converter 18 reads out the corresponding A/D-converted data and parity bits from the storage register 28 and sends them to the abnormality detection apparatus 19.

The abnormality detection apparatus 19 checks the parity from the A/D-converted data and parity bits that are obtained, and sets an A/D-converted data abnormality flag when the parity bit is abnormal (S14: No) to end the processing (S18). When the parity bit is normal (S14: Yes), on the other hand, the abnormality detection apparatus 19 checks the A/D-converted data described above (S15 and subsequent steps).

The present invention should not be limited to the disclosed embodiment, but may be modified in many other ways without departing from the spirit of the invention.

What is claimed is:

1. An apparatus for detecting an A/D converter abnormality comprising:
   an A/D converter having input terminals of one or more channels for inputting analog signal voltages and a capacitor for sample-holding the analog signal voltages, and for AD-converting the analog signal voltages sample-held in the capacitor into digital signal values;
   input means for inputting analog signals to the input terminals of at least one channel, a signal operation voltage range being limited to be narrower than a range of input operation voltages of the A/D converter when the analog signals are normal;
   a storage means storing in advance an abnormality determining range of the digital signal values converted by the A/D converter;
   voltage range setting means for setting the abnormality determining range to values corresponding to a voltage range in an input voltage range of the A/D converter outside the limited range of signal operation voltages;
   means for detecting an A/D converter abnormality to determine an A/D conversion to be abnormal when a value of a digital signal converted from the limited analog signal lies in the abnormality determining range; and
   initializing means for initializing the voltage accumulated in the capacitor by a last A/D conversion operation into a voltage that lies within the abnormality determining range at least prior to sample-holding the limited analog input signal voltage in the capacitor.

2. An apparatus for detecting an A/D converter abnormality as in claim 1, wherein the initializing means initializes a voltage accumulated in the capacitor to a higher reference voltage out of the reference voltages that serve as a reference for the A/D conversion.

3. An apparatus for detecting an A/D converter abnormality as in claim 1, wherein the initializing means initializes a voltage accumulated in the capacitor to a lower reference voltage out of the reference voltages that serve as a reference for the A/D conversion.

4. An apparatus for detecting an A/D converter abnormality as in claim 1, wherein the means for detecting an abnormality has ideal value storage means for storing an ideal value obtained by AD-converting a voltage value of when a voltage accumulated in the capacitor is initialized by the initializing means with at least one of the input terminals opened, compares a digital signal value that is A/D-converted with the input terminal opened with the ideal value, and determines the A/D converter to be abnormal when a difference between the two exceeds a predetermined value.

5. An apparatus for detecting an A/D converter abnormality comprising:
   an A/D converter having input terminals of two or more channels for inputting analog signal voltages, and for AD-converting the analog signal voltages into digital signal values;
   abnormality detecting voltage forming means for forming a predetermined abnormality detecting voltage from a power source separate from a power source for operating the A/D converter and from a power source for forming a reference voltage that serves as a reference for the A/D conversion;
   ideal value storage means for storing an ideal value of when the abnormality detecting voltage is put to an A/D conversion; and
   abnormality detecting means which inputs the abnormality detecting voltage to at least one channel of the A/D converter and compares the A/D-converted value thereof with the ideal value to determine the A/D converter to be abnormal when a difference between the two exceeds a predetermined value.

6. An apparatus for detecting an A/D converter abnormality as in claim 5, wherein a microcomputer that operates on a plurality of power sources and incorporates the A/D converter further incorporates an abnormality detecting voltage forming circuit for forming the predetermined abnormality detecting voltage from the power source of the microcomputer that is connected to neither the power source of the A/D converter incorporated therein nor the reference voltage.

7. An apparatus for detecting an A/D converter abnormality which has input terminals of three or more channels for inputting analog signal voltages and for AD-converting the analog signal voltages into digital signal values, the apparatus comprising:
   setting means for setting voltage values of at least two points so that values after an A/D conversion establish a predetermined relationship;
   calculation means for finding a relationship of voltage values of at least the two points from the A/D-converted values of the voltage values of at least the two points; and
   abnormality detecting means which compares the calculated relationship of the voltage values of at least the two points with the predetermined relationship, and determines the A/D converter to be abnormal when a difference between the two exceeds a predetermined value.

8. An apparatus for detecting an A/D converter abnormality as in claim 7, wherein the setting means sets the linearity calculated from the voltage values of at least the two points as the predetermined relationship.

9. An apparatus for detecting an A/D converter abnormality as in claim 7, wherein the setting means sets the predetermined relationship so that a ratio of the voltage values of at least the two points assumes a predetermined value.

10. An apparatus for detecting an A/D converter abnormality as in claim 7, wherein the setting means sets the predetermined relationship so that a difference between the voltage values of at least the two points assumes a predetermined value.

11. An apparatus for detecting an A/D converter abnormality as in claim 7, wherein the setting means sets the predetermined relationship so that one of the voltage values of at least the two points becomes a value obtained by multiplying the other voltage value by a predetermined ratio and adding a predetermined value thereto.

12. An apparatus for detecting an A/D converter abnormality as in claim 7, wherein one of the voltage values of at least two points is set to a voltage value of when a voltage accumulated in the capacitor, that is a voltage of when the input is opened, is initialized.

13. An apparatus for detecting an A/D converter abnormality as in claim 7, wherein one of the voltage values of at least two points input to the input terminals is set to a predetermined voltage value formed from a power source separate from the power source for operating the A/D converter or from the power source for forming a reference voltage that serves as a reference for the A/D conversion.

14. An apparatus for detecting an A/D converter abnormality as in claim 7, wherein the setting means sets the voltages of the two points to a higher reference voltage and to a lower reference voltage that serve as references for the A/D conversion.

15. An apparatus for detecting an A/D converter abnormality as in claim 7, wherein:
the A/D converter includes a capacitor for sample-holding the analog signal voltage, and initializing means for initializing the voltage accumulated in the capacitor into a voltage that lies within the abnormality determining range prior to sample-holding the value of the analog signal voltage in the capacitor; and
the setting means sets one of the voltages of the two points to be a higher reference voltage of the reference voltages that serve as the references for the A/D conversion, sets the other to be a voltage in an open state, and sets the voltage value accumulated in the capacitor to be a lower reference voltage of the reference voltages that serve as the reference for the A/D conversion.

16. An apparatus for detecting an A/D converter abnormality as in claim 7, wherein:
the A/D converter includes a capacitor for sample-holding the analog signal voltage, and initializing means for initializing the voltage accumulated in the capacitor into a voltage that lies within the abnormality determining range prior to sample-holding the value of the analog signal voltage in the capacitor; and
the setting means sets one of the voltages of the two points to be a lower reference voltage of the reference voltages that serve as the references for the A/D conversion, sets the other to be a voltage in an open state, and sets the initialized voltage of the capacitor to be an higher reference voltage of the reference voltages that serve as the references for the A/D conversion.

17. An apparatus for detecting an A/D converter abnormality as in claim 7, wherein the input terminals are imparted with numbers corresponding thereto, the voltage value of one point between the voltage values of the two points is input to all input terminals which are expressed by 0 by the binary notation, and the voltage value of the other point is input to all input terminals which are expressed by 1 by the binary notation.

18. An apparatus for detecting an A/D converter abnormality comprising:
an A/D converter having at least one input terminal (AIN1, AIN2) for inputting an analog signal voltage, and for AD-converting a voltage value of the analog signal into a digital signal value;
a parity calculation circuit for adding a parity bit to an A/D-converted value of the analog signal;
a converted result storage circuit for storing the A/D-converted value of the analog signal and the parity bit; and
abnormality detecting means for reading the A/D-converted value from the converted result storage circuit, checking the matching of the parity bit, and determining the A/D converter to be abnormal when the parity bit is mismatching.

* * * * *